United States Patent
Naito et al.

(10) Patent No.: US 9,231,183 B2
(45) Date of Patent: Jan. 5, 2016

(54) RESONATOR ELEMENT, RESONATOR, ELECTRONIC DEVICE AND ELECTRONIC APPARATUS

(71) Applicant: Seiko Epson Corporation, Tokyo (JP)

(72) Inventors: Matsutaro Naito, Kamiina (JP); Hideo Endo, Kamiina (JP)

(73) Assignee: Seiko Epson Corporation (JP)

( * ) Notice: Subject to any disclaimer, the term of this patent is extended or adjusted under 35 U.S.C. 154(b) by 368 days.

(21) Appl. No.: 13/845,646

(22) Filed: Mar. 18, 2013

(65) Prior Publication Data

US 2013/0241359 A1  Sep. 19, 2013

(30) Foreign Application Priority Data

Mar. 19, 2012  (JP) ................. 2012-062118

(51) Int. Cl.
| | |
|---|---|
| *H03H 9/02* | (2006.01) |
| *H03H 9/19* | (2006.01) |
| *H01L 41/053* | (2006.01) |
| *H03H 9/17* | (2006.01) |

(52) U.S. Cl.
CPC ......... *H01L 41/053* (2013.01); *H03H 9/02062* (2013.01); *H03H 9/02157* (2013.01); *H03H 9/177* (2013.01); *H03H 9/19* (2013.01)

(58) Field of Classification Search
CPC ......... H03H 9/05; H03H 9/0504; H03H 9/10; H03H 9/1007; H03H 9/1021; H03H 9/15; H03H 9/17; H03H 9/19; H03H 9/21
USPC .......................................... 310/320, 348, 368
See application file for complete search history.

(56) References Cited

U.S. PATENT DOCUMENTS

| | | |
|---|---|---|
| 2007/0096596 A1 | 5/2007 | Naito et al. |
| 2010/0207696 A1* | 8/2010 | Sayama ........................ 310/348 |
| 2012/0126668 A1 | 5/2012 | Ii et al. |
| 2012/0229223 A1 | 9/2012 | Ii et al. |
| 2012/0235762 A1 | 9/2012 | Ii et al. |

FOREIGN PATENT DOCUMENTS

| | | |
|---|---|---|
| JP | 2006-340023 | 12/2006 |
| JP | 2007-053820 | 3/2007 |
| JP | 2007-124441 | 5/2007 |
| JP | 2008-263387 | 10/2008 |
| JP | 2008-306594 | 12/2008 |
| JP | 2009-010864 | 1/2009 |
| JP | 2009-065270 | 3/2009 |
| JP | 2009-130564 | 6/2009 |
| JP | 2009-135830 | 6/2009 |
| JP | 2009-246645 | 10/2009 |

(Continued)

OTHER PUBLICATIONS

Goka et al., "Decoupling Effect of Multi-stepped Bi-mesa AT-cut Quartz Resonators", 2003.*

*Primary Examiner* — Derek Rosenau
(74) *Attorney, Agent, or Firm* — Harness, Dickey & Pierce, P.L.C.

(57) ABSTRACT

When a length along a vibrating direction of the thickness shear vibration of a multi-stage type mesa substrate of A resonator element is x, a thickness of the vibration section is t, and a distance between the vibration section and the bonding region is y, y is in a range of $-0.0151 \times (x/t) + 0.3471 \le y \le -0.0121 \times (x/t) + 0.3471$.

10 Claims, 7 Drawing Sheets

(56) References Cited

FOREIGN PATENT DOCUMENTS

| JP | 2009-267888 | 11/2009 |
| JP | 2010-028610 | 2/2010 |
| JP | 2010-109527 | 5/2010 |
| JP | 2012-114495 | 6/2012 |
| JP | 2012-114496 | 6/2012 |
| JP | 2012-191299 | 10/2012 |
| JP | 2012-191300 | 10/2012 |
| JP | 2012-199602 | 10/2012 |

* cited by examiner

RESONATOR ELEMENT, RESONATOR, ELECTRONIC DEVICE AND ELECTRONIC APPARATUS

BACKGROUND

1. Technical Field

The present invention relates to a resonator element, a resonator, an electronic device and an electronic apparatus.

2. Related Art

In recent years, as a piezoelectric resonator element tends to be small, it is desirable that a CI (crystal impedance) value be decreased. It is known to adopt a mesa structure in order to decrease the CI value and confine vibration energy.

JP-A-2007-124441 discloses a piezoelectric resonator element that defines an optimum value of an etching amount from a substrate for obtaining a mesa structure. More specifically, in JP-A-2007-124441, when the etching amount is Md, a length of a long side of a quartz crystal substrate is x, and a thickness of a vibration section is t, if a percentage y of a ratio to the thickness of an etching amount Md of a step portion with reference to the thickness t is set, a relationship of $y=-1.32\times(x/t)+42.87$ is satisfied. Therefore, it is disclosed that a minimum etching amount Md can be selected to allow a characteristic change in the CI value to be flat.

Further, JP-A-2008-263387 discloses that not only an optimum value of the etching amount from the substrate, but also a range of the length of the long side in an application range of conductive adhesive applied when the piezoelectric resonator element is mounted on a mount substrate are defined to suppress a binding of an unnecessary mode, and to promote a decrease in the IC value.

Furthermore, JP-A-2010-28610 discloses that a length from an end of a vibration section to an end of an excitation electrode is defined to suppress characteristic deterioration such as an increase in the CI value.

Therefore, the decrease in the CI value has been contemplated from various viewpoints.

SUMMARY

An advantage of some aspects of the invention is to provide a resonator element capable of achieving a miniaturization and decreasing a CI value. Another advantage of some aspects of the invention is to provide a resonator having the resonator element. Still another advantage of some aspects of the invention is to provide an electronic device having the resonator element. Yet another advantage of some aspects of the invention is to provide an electronic apparatus having the resonator element.

The invention can be realized as the following aspects or application examples.

Application Example 1

This application example is directed to a resonator element including a substrate having a vibration section that vibrates in a thickness shear vibration mode and has a step on a side surface, an outer edge that is disposed along an outer side of the vibration section and has a thickness thinner than that of the vibration section; and a bonding region that is provided on the outer edge and allows a bonding agent to be bonded for fixing to the mounting substrate; wherein when a length along a vibrating direction of the thickness shear vibration of the substrate is x, a thickness of the vibration section is t, and a distance Lx between the vibration section and the bonding region is y, y is in a range of $-0.0151\times(x/t)+0.3471 \le y \le -0.0121\times(x/t)+0.3471$, and wherein when a difference between the thickness of the vibration section and the thickness of the outer edge is Md, and a percentage of a ratio of the Md to t is z, a relationship of $-5 \le z+1.32\times(x/t)-42.87(\%)$ is satisfied.

According to the resonator element of this application example, the resonator element is capable of decreasing a CI value while being miniaturized (to be described in detail later).

Application Example 2

In the resonator element according to the application example, the relationship of $-5 \le z+1.32\times(x/t)-42.87 \le 5(\%)$ may be satisfied.

According to the resonator element of this application example, a possibility of etching corrosion and deteriorated vibration characteristics may be reduced and thus obtain improved vibration characteristics.

Application Example 3

In the resonator element according to the application example, a edge ratio of the x (x/t) to the t is 30 or less.

According to the resonator element of this application example, the resonator element is capable of decreasing the CI value while being miniaturized.

Application Example 4

In the resonator element according to the application example, the substrate is a rotated Y-cut substrate.

According to the resonator element of this application example, the resonator element is capable of decreasing the CI value while being miniaturized.

Application Example 5

This application example is directed to a resonator including the resonator element according to the application example and a package that accommodates the resonator element.

The resonator of this application example includes the resonator element capable of decreasing the CI value while being miniaturized.

Application Example 6

This application example is directed to an electronic device including the resonator element according to the application example and an electronic element.

The electronic device of this application example includes the resonator element capable of decreasing the CI value while being miniaturized.

Application Example 7

This application example is directed to an electronic apparatus including the resonator element according to the application example.

The electronic apparatus of this application example includes the resonator element capable of decreasing the CI value while being miniaturized.

Application Example 8

In the resonator element according to the application example, the substrate may have a two-stage type mesa structure.

Application Example 9

In the resonator element according to the application example, a length along the vibrating direction of a first stage of the thickness shear vibration of the substrate is longer than that of the vibrating direction of a second stage of the thickness shear vibration of a multi-stage type mesa substrate.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments will be described in detail with reference to the drawings. In addition, the embodiments described below do not unreasonably limit the content of the invention disclosed in the appended claims. In addition, not all configurations described below are limited to essential configuring elements of the invention.

1. Vibration Device

Figure 1:
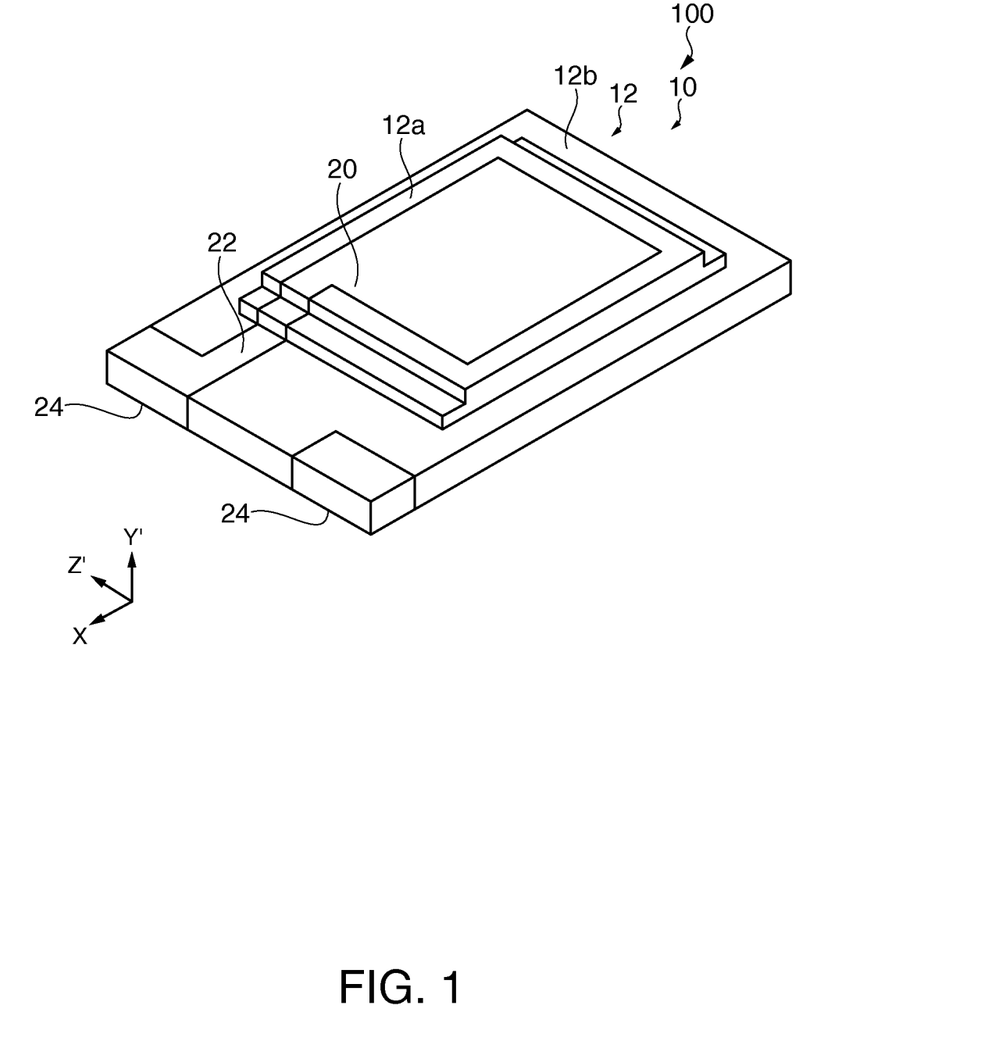
FIG. 1 is a perspective view schematically illustrating a vibration device according to the embodiment.
Figure 2:
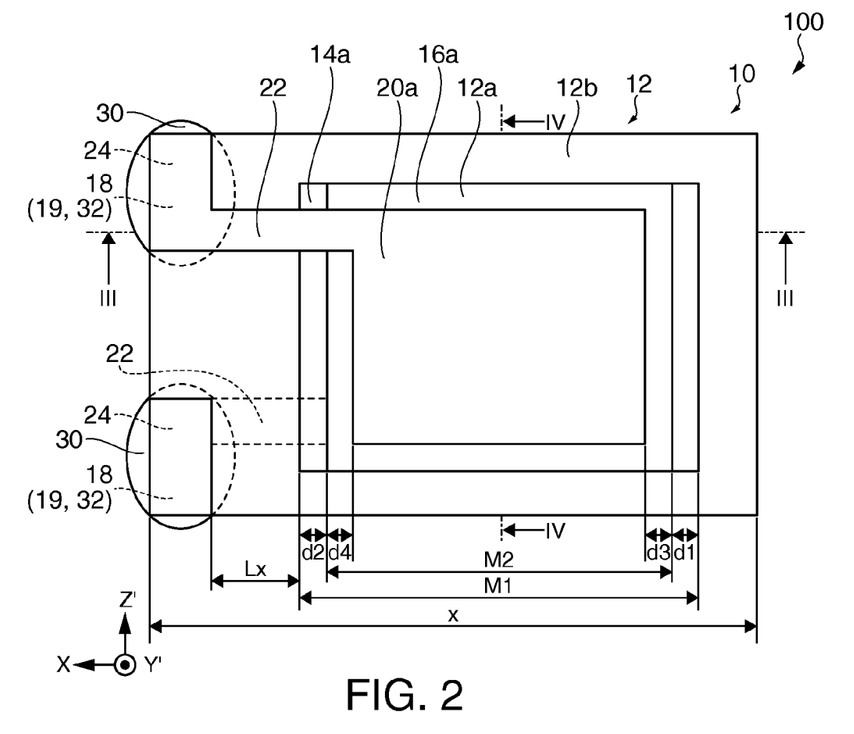
FIG. 2 is a plan view schematically illustrating a vibration device according to the embodiment.
Figure 3:
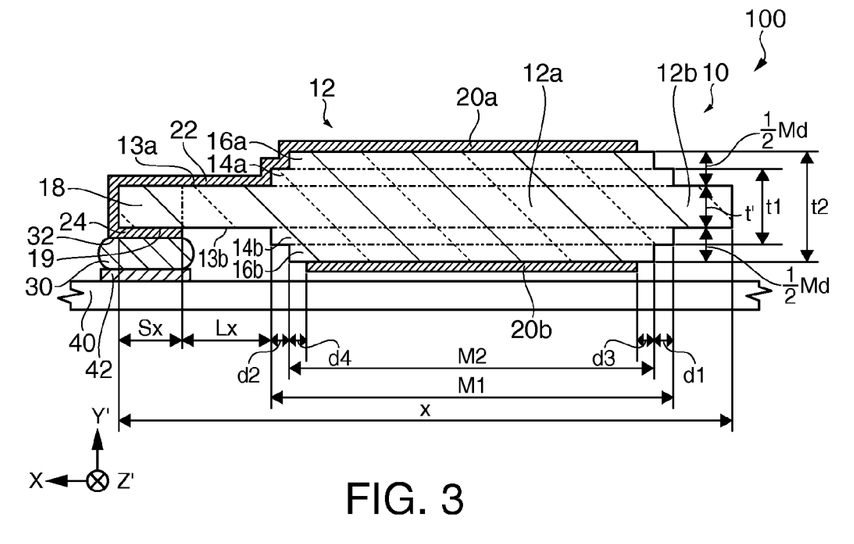
FIG. 3 is a cross-sectional view schematically illustrating a vibration device according to the embodiment.
Figure 4:
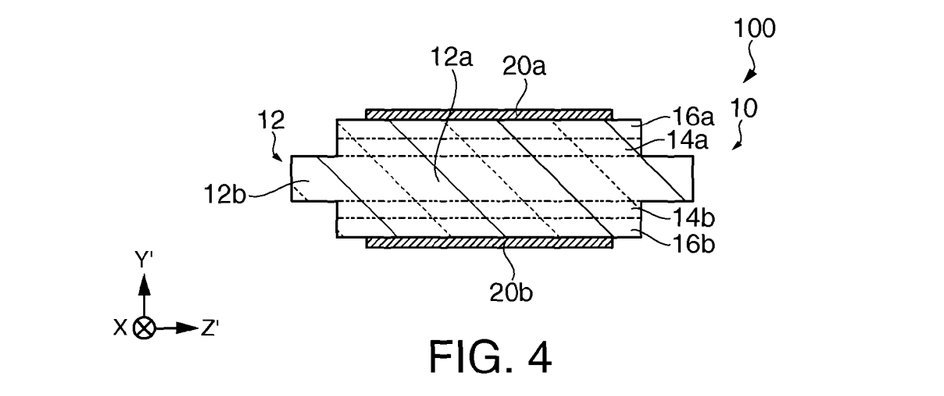
FIG. 4 is a cross-sectional view schematically illustrating a vibration device according to the embodiment.

First, a vibration device will be described with reference to the drawings. FIG. 1 is a perspective view schematically illustrating a vibration device 100 according to the embodiment. FIG. 2 is a plan view schematically illustrating the vibration device 100 according to the embodiment. FIG. 3 is a cross-sectional view taken along the line III-III in FIG. 2, schematically illustrating a vibration device 100 according to the embodiment. FIG. 4 is a cross-sectional view taken along the line IV-IV in FIG. 2, schematically illustrating the vibration device 100 according to the embodiment.

As illustrated in FIGS. 1 to 4, the vibration device 100 includes a resonator element 10, an excitation electrodes 20a and 20b, a connection electrode 22 and a mount electrode 24.

The resonator element 10 is configured to include a mesa substrate 12 of a mesa structure having a vibration section 12a and the outer edge 12b. For example, the mesa substrate 12 employs a piezoelectric substrate. More specifically, the mesa substrate 12 employs a rotated Y-cut substrate such as an AT-cut quartz crystal substrate.

Figure 5:
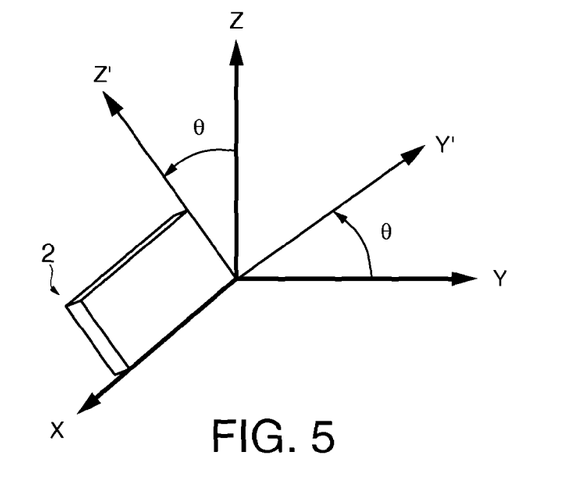
FIG. 5 is a perspective view schematically illustrating an AT-cut quartz crystal substrate.

Herein, FIG. 5 is a perspective view schematically illustrating the AT cut quartz crystal substrate 2. A piezoelectric material such as quartz crystal is generally a trigonal system, and has crystal axes (X, Y, Z) illustrated in FIG. 5. The X axis is an electrical axis, the Y axis is a mechanical axis, and the Z axis is an optical axis. The rotated Y-cut substrate is a flat plate that is cut out from the piezoelectric material (for example, synthetic quartz crystal) along a plane on which an XZ plane is rotated around the X axis by an angle $\theta$. Herein, for example, the AT-cut quartz crystal substrate 2 has the angle $\theta=35°$ 15'. When the Y axis and the Z axis are rotated around the X axis by the angle $\theta$, the Y axis and the Z axis are set to be a Y' axis and a Z' axis respectively. Therefore, the rotated-Y cut substrate has the crystal axes (X, Y', Z'). In the AT-cut quartz crystal substrate 2 having $\theta=35°$ 15', a plane XZ' (a plane including the X axis and Z' axis) orthogonal to the Y' axis becomes a main surface (an excitation surface), and can vibrate in a thickness shear vibration mode as a main vibration. The AT cut-quartz crystal substrate 2 may be processed to obtain the mesa structure 12.

That is, the mesa substrate 12 is made of the AT-cut quartz crystal substrate which is configured on a surface parallel to the X axis and the Z' axis and has a thickness in a direction parallel to the Y' axis, when the X' axis as the electrical axis, the Y axis as the mechanical axis, and the z axis as the optical axis, all of which are the crystal axes of the quartz crystal as illustrated in FIG. 5, for example, form an orthogonal coordinate system, and about the center of the X-axis of the orthogonal coordinate system, an axis inclining the Z axis in a −Y axial direction of the Y axis is set to the Z' axis and an axis inclining the Y axis in a +Z direction of the Z axis is set to the Y' axis.

In addition, the mesa substrate 12 is not limited to the AT-cut quartz crystal substrate. For example, by establishing $\theta=-49°$ (49° rotation opposite to the arrow direction of $\theta$ illustrated in FIG. 5), it is possible to obtain a BT-cut quartz crystal substrate. In addition, an SC-cut quartz crystal substrate can be obtained in such a way that a surface orthogonal to the Y axis of the quartz crystal is rotated approximately 33° about the center of the X axis, and then the surface further rotated by approximately 22° about the center of the Z axis from the rotated position is cut out.

The mesa substrate 12 has a rectangular shape in plan view as illustrated in FIG. 2 (when viewed from the Y' axial direction). A long side of the mesa substrate 12 is formed along the X axis of the quartz crystal, and a short side of the mesa substrate 12 is formed along the Z' axis orthogonal to the X axis of the quartz crystal.

As illustrated in FIG. 3, the mesa substrate 12 has a first main surface 13a, and a second main surface 13b. The first and second main surfaces 13a and 13b are surfaces parallel to the XZ' plane. In an illustrated example, the first main surface 13a is the surface facing the +Y' axial direction, and the second main surface 13b is the surface facing the -Y' axial direction.

The mesa substrate 12 has a multi-stage type mesa structure. In an illustrated example, the mesa substrate 12 has a two-stage type mesa structure. That is, the mesa structure 12 has two surfaces which are located in the +Y' axial direction further than the first main surface 13a, and has different heights (a distance from or to the first main surface 13a in the Y' axial direction). In addition, the mesa substrate 12 has two different surfaces which are located in the -Y' direction further than the second min surface 13b, and has different heights (a distance from or the second main surface 13b in the Y' axial direction).

The mesa substrate 12 has the two-stage type mesa structure, and thus the vibration device 100 can obtain a high energy confinement effect. In addition, if the mesa substrate 12 is the multi-stage type mesa structure, for example, a three-stage type mesa structure may be adopted without being limited to the two-stage type mesa structure.

In the two-stage type mesa structure, the mesa substrate 12 includes a first portion 14a configuring a first stage of the first main surface 13a side and a second portion 16a having a second stage thereof, and a first portion 14b configuring a first stage of the second main surface 13b side and a second portion 16b configuring a second stage thereof. As illustrated in FIG. 3, in the mesa substrate 12, the first portion 14a and the second portion 16a, and the first portion 14b and the second portion 16b allow a side surface (end) of the vibration section 12a in the X axial direction to have a step shape to form steps. That is, the steps are formed in the side surface of the vibration section 12a in the X axial direction. A length M1 of the first portion 14a and the third portion 14b in the X axial direction (a direction parallel to the long side of the mesa substrate 12) is longer than a length M2 of the second portion 16a and the fourth portion 16b in the X axial direction.

As illustrated in FIG. 4, the side surface (an end) of the vibration section 12a in the Z' axial direction does not have the step shape. That is, an end surface of the first portion 14a and the second portion 16b in the Z' axial direction is flush, and an end surface of the third portion 14b and the fourth portion 16b in the Z' axial direction is flush.

In the example illustrated in FIG. 3, the first portion 14a and the third portion 14b are symmetrically arranged with respect to the XZ' plane passing through the center of the mesa substrate 12. Similarly, the second portion 16a and the fourth portion 16b are symmetrically arranged with respect to the XZ' plane passing through the center of the mesa substrate 12.

As illustrated in FIG. 2, a planar shape of the first portion 14a, the second portion 16a, the third portion 14b and the fourth portion 16b has a rectangular shape in which a side along the X axis is set to be a long side, and a side along the Z' axis is set to be a short side. The vibration section 12a can be configured by the first portion 14a, the second portion 16a, the third portion 14b, and the fourth portion 16b.

In the mesa substrates 12, the vibration section 12a is a portion having a thickness thicker than a thickness t' of the outer edge 12b. Specifically, the vibration section 12a has a portion having a thickness t1 thicker than the thickness t', and a portion having a thickness t2 thicker than the thickness t1. The vibration section 12a can be excited using a thickness shear vibration and can vibrate in the thickness shear vibration mode as the main vibration. In this case, the thickness shear vibration vibrates along the X axial direction.

As illustrated in FIG. 2, the vibration section 12a is surrounded by the outer edge 12b in plan view. As illustrated in FIG. 2, a planar shape of the vibration section 12a is a rectangular shape in which a side along the X axis is set to be the long side, and a side along the Z' axis is set to be a short side.

The outer edge 12b is disposed along an outer edge (in the periphery) of the vibration section 12a. The outer edge 12b has a thickness thinner than that of the vibration section 12a. More specifically, the outer edge 12b has a thickness t' thinner than the thickness of the vibration section 12a. The outer edge 12b has a fixed portion 18 to be fixed by a bonding agent 30 when the vibration device 100 is fixed (bonded) to the mounting substrate 40. In the example illustrated in FIG. 3, the fixed portion 18 is a portion positioned above a contact surface 32 with the mount electrode 24 of the bonding agent 30. That is, as illustrated in FIG. 2, the fixed portion 18 is a portion which is overlapped with the contact surface 32 in plan view. For example, the fixed portion 18 is provided further than the vibration section 12a in the +X axial direction. The planer shape of the fixed portion 18, for example, is a rectangular shape without being limited thereto.

The fixed portion 18 of the outer edge 12b is provided with a bonding region 19 to which the bonding agent 30 for fixing (bonding) the vibration device 100 to the mounting substrate 40 is bonded. In the example illustrated in FIG. 3, the bonding agent 30 is bonded to the bonding region 19 via the mount electrode 24. The bonding region 19 is located in a lower surface of the fixed portion 18 (the second main surface 13b).

In addition, for convenience, in FIG. 1, the bonding agent 30 and the mounting substrate 40 are not illustrated, and in FIGS. 2 and 4, the mounting substrate 40 is not illustrated.

The mesa substrate 12 having the vibration section 12a and the outer edge 12b is formed in such a way that a portion forming the vibration section 12a of a piezoelectric substrate (not illustrated) having a plate shape is covered by a protective film (not illustrated), and a portion forming the outer edge 12b is subjected to chemical etching (etching). In addition, the mesa substrate 12 having the two-stage type mesa structure can be formed in such a way that a portion forming the second portion 16a and the fourth portion 16b is covered by a protective film, and a portion forming the first portion 14a and the third portion 14b is subjected to a chemical etching.

When a length of the long side of the mesa substrate 12 (a length along a vibrating direction of the thickness shear vibration of the mesa substrate 12 is x, a thickness of the vibration section 12a is t, and a distance Lx between the vibration section 12a and the bonding region 19 is y, y is in a range of $-0.0151 \times (x/t) + 0.3471 \leq y \leq -0.0121 \times (x/t) + 0.3471$ (1). By satisfying the equation (1), the resonator element 10 is capable of decreasing the CI value while being miniaturized (details will be described later). In addition, the distance Lx between the vibration section 12a and the bonding region 19 is the shortest distance between the vibration section 12a and the bonding region 19, which represents a distance in the X axis. Further, the thickness t of the vibration section 12a represents the maximum thickness (in the example illustrated in FIG. 3, the thickness t2) of the vibration section 12.

When an etching amount (a difference between the thickness t of the vibration section 12a and the thickness t' of the outer edge 12) of the mesa substrates 12 for obtaining the mesa structure is Md, it is preferable that a percentage z of a ratio to the thickness t of the vibration section 12a of the amount of etching Md satisfies the following equation.

$$Z = -1.32 \times (x/t) + 42.87 (\%) \quad (2)$$

By satisfying the equation (2), it is possible to select the value of the minimum etching amount Md which allows the characteristic change of the CI value to be flat. That is, the larger the etching amount Md becomes, the more the CI value tends to decrease. However, if the etching time for forming the etching amount Md becomes long, the protective film formed on the portion other than the etching portion is deteriorated and, the etching corrosion occurs. The etching corrosion shows different tendencies depending on states of the protective film and the mesa substrate, and thus variations of the mesa substrate shape increases due to the etching corrosion. In addition, as an etching time increases, a manufacturing cost becomes high. Further, the binding of an unnecessary mode with respect to the main vibration mode shows an opposite tendency to the decrease in the CI value caused by the increase in the etching amount Md. Therefore, when the etching amount Md is allowed to increase, a bending mode that is an unnecessary mode is easily added to the thickness shear mode that is a primary mode and thus there is a possibility of deteriorated vibration characteristics. Therefore, if the minimum value which allows the characteristic change of the CI value to be flat can be selected as the etching amount Md, a possibility of the etching corrosion and the deteriorated vibration characteristics may be reduced and thus it is possible to obtain improved vibration characteristics.

Herein, even if a percentage of the ratio z to the thickness t of the vibration section 12a of the etching amount Md is decreased by 5% less than the value calculated from the equation (2), it is possible to sufficiently decrease the CI value. Therefore, z may satisfy the relationship of the following equation (3).

$$-5 \leq z + 1.32 \times (x/t) - 42.87 (\%) \quad (3)$$

In addition, even if a percentage of the ratio z to the thickness t of the vibration section 12a of the etching amount Md is 5% more than the value calculated from the equation (2), it is possible to sufficiently suppress the occurrence of the etching corrosion and the binding of the unnecessary mode with respect to the main vibration mode. Therefore, z may satisfy the relationship of the following equation (4).

$$-5 \leq z + 1.32 \times (x/t) - 42.87 \leq 5 (\%) \quad (4)$$

In addition, the equation (2) is a equation obtained in a such way that the etching amount Md is allowed to vary for each edge ratio x/t (the ratio representing the length x of the long side of the mesa substrate 12 with respect to the thickness t of the vibration section 12a) and thereby experiments are performed to analyze the change of the CI value, and a minimum value Md_min of the etching amount Md which allows the characteristic change of the CI value to be flat is obtained. In a case of the resonator element having the mesa structure, the equation (2) is applicable without limiting the number of stages of the mesa structure.

Furthermore, it is preferable to set the edge ratio x/t to 30 or less. When the edge ratio (x/t) exceeds 30, the value Md_min remarkably decreases, and thus it is unnecessary to form the substrate as the mesa type. That is, even if the substrate is not formed as the mesa type, it is possible to obtain a low CI value. Therefore, the substrate in which the edge ratio x/t is 30 or less is formed, and thus the CI value can be decreased while the substrate being miniaturized.

The first excitation electrode 20a and the second excitation electrode 20b are disposed on the surface of the vibration section 12a. More specifically, the first excitation electrode 20a is disposed on the surface of the second portion 16a, and the second excitation electrode 20b is disposed on the surface of the fourth portion 16b. As illustrated in FIG. 2, in plan view, the first excitation electrode 20a is disposed within the outer edge of the second portion 16a, and the second excitation electrode 20b is disposed within the outer edge of the fourth portion 16b. In the examples illustrated in FIGS. 3 and 4, the vibration section 12a is interposed between the excitation electrodes 20a and 20b. For example, the center of the excitation electrodes 20a and 20b is overlapped with the center of the vibration section 12a in plan view. The excitation electrode 20a and 20b can apply a voltage to the vibration section 12a.

The excitation electrodes 20a and 20b are connected to the mount electrode 24 via the connection electrode 22. The mount electrode 24 is disposed on the bonding region 19 of the fixed portion 18 (the outer edge 12b). The mount electrode 24 can be in contact with the bonding agent 30. In the example illustrated in FIG. 2, the planner shape of the mount electrode 24 is the same as that of the contact surface 32 with the mount electrode 24 of the bonding agent 30.

The excitation electrodes 20a and 20b, the connection electrode 22 and the mount electrode 24 are configured, for example, by laminating chromium and gold on the mesa substrate 12 side in this order. For example, the excitation electrodes 20a and 20b, the connection electrode 22 and the mount electrode 24 are formed for example by a sputtering method and a vacuum deposition method.

The bonding agent 30 can fix (bond) the vibration device 100 to the mounting substrate 40. In the example illustrated in FIG. 3, the bonding agent 30 bonds the mount electrode 24 disposed on the outer edge 12b of the resonator element 10, and the terminal 42 disposed on the mounting substrate 40. The bonding agent 30 may use a conductive adhesive, and more specifically, the bonding agent 30 may use a silver paste.

The mounting substrate 40 is a substrate to which the vibration device 100 is bonded (mounted). In particular, the shape of the mounting substrate 40 is not limited if the vibration device 100 can be bonded thereto. More specifically, the mounting substrate 40 can use a package base 40 (for example, see FIG. 12 described below) configuring a package.

For example, the vibration device 100 (the resonator element 10) according to the embodiment has the following characteristics.

According to the resonator element 10, the equation (1) can be satisfied. Therefore, the resonator element 10 is capable of decreasing the CI value while being miniaturized (described in detail later).

According to the resonator element 10, the equation (3) can be satisfied, and further the equation (4) can be satisfied. Therefore, in the resonator element 10, as described above, the minimum value which allows the characteristic change of the CI value to be flat can be selected. As a result, in the resonator element 10, a possibility of the etching corrosion and the deteriorated vibration characteristics can be reduced and thus it is possible to obtain improved vibration characteristics.

According to the resonator element 10, the edge ratio x/t is 30 or less. As described above, when the edge ratio x/t exceeds 30, the value Md_min remarkably decreases, and thus it is unnecessary to form the substrate as the mesa type.

Therefore, the substrate in which the edge ratio x/t is 30 or less is formed as the mesa type, and thus the resonator element 10 is capable of decreasing the CI value while being miniaturized.

2. Experimental Example

An experimental example will be described. The invention is not limited in any circumstance by the following experimental example.

Figure 6:
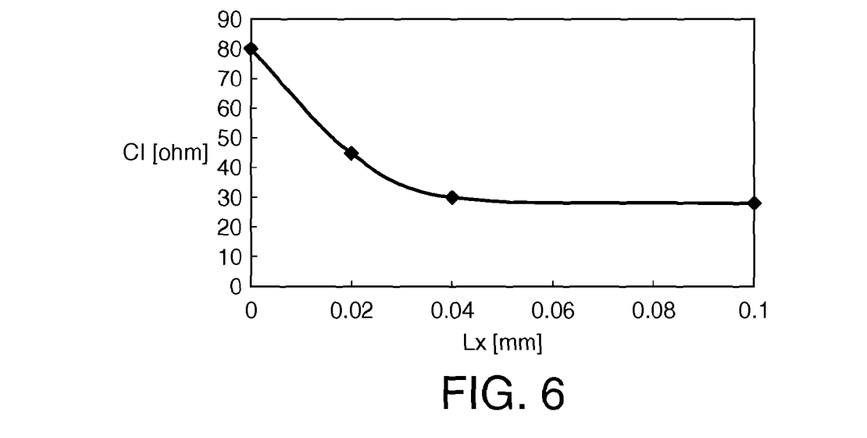
FIG. 6 is a graph illustrating a relationship between a distance Lx from a vibration section to a fixed section, and a CI value.

The inventors of the invention have found that through experiments using the vibration device 100 illustrated in FIGS. 1 to 4 being performed, the relationship between the distance Lx from the vibration section 12*a* to the bonding region 19 and the CI value shows the tendency as illustrated in FIG. 6. Referring to FIG. 6, it is appreciated that when the distance Lx is allowed to increase, the CI value of the vibration device 100 (the resonator element 10) tends to decrease, and when the distance Lx reaches a certain value and even if thereafter the distance Lx is allowed to be increase, the characteristic change of the CI value substantially remains in a flat state. In FIG. 6, the minimum value Lx_min of the distance Lx which allows the characteristic change of the CI value to be flat was 0.04 mm. That is, in the example illustrated in FIG. 6, the distance Lx is set to be 0.04 mm, and thus the resonator element 10 is capable of decreasing the CI value while being miniaturized. For example, even if the distance Lx is set to be 0.10 mm, the resonator element 10 can have the CI value equal to 0.04 mm. However, the value of the distance Lx is larger than 0.04 mm, and correspondingly the miniaturization thereof is not achieved as much. In addition, the relationship between the distance Lx and the CI value illustrated in FIG. 6 relates to the resonator element 10 in which the edge ratio x/t (frequency 24 MHz) is 20.

As illustrated in FIG. 6, the reason why the CI value increases as the distance Lx decreases is considered that for example, the influence resulting from the bonding agent 30 as the distance Lx decreases is easily exerted on the vibration section 12*a*, and the confinement effect of the main vibration (the thickness shear vibration) of the vibration section 12*a* decreases.

In addition, in the experimental example, the size Sx of the bonding region 19 in the −X axial direction is made constant, a distance d1 between an end of the first stage (the first portion 14*a* and the third portion 14*b*) of the mesa in the −X axial direction and an end of the second stage (the second portion 16*a* and the fourth portion 16*b*) of the mesa in the −X axial direction is made constant, a distance d2 between an end of the first stage of the mesa in the +X axial direction and the end of the second stage of the mesa in the +X axial direction is made constant, a distance d3 between an end of the second stage of the mesa in the +X axial direction and an end of the excitation electrode 20 in the +X axial direction is made constant, and a distance d4 between an end of the second stage of the mesa in the −X axial direction and the end of the excitation electrode 20 in the −X axial direction is made constant, whereby the distance Lx being changed. Furthermore, in the experimental example, in a state in which the centers of the first portion 14*a*, the second portion 16*a*, the third portion 14*b*, the fourth portion 16*b*, and the excitation electrodes 20*a* and 20*b* are overlapped with one on another in the plane, the distance Lx is changed. In addition, in the experimental example, the AT-cut quartz crystal substrate is used as the mesa substrate 12, and thus the two-stage mesa structure having the etching amount Md which satisfies the equation (2) was formed. In addition, in the experimental example, a conductive adhesive of a silver paste was used as the bonding agent 30. Further, in the experimental example, the planar shape of the mesa substrate 12 and the vibration section 12*a* is set to be the rectangular shape having the long side along the X axis, and the bonding agent 30 is located in the +X axial direction further than the vibration section 12*a*.

Figure 7:
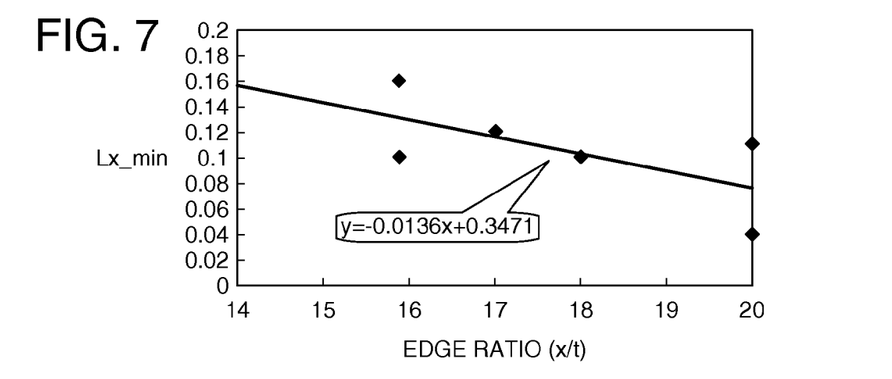
FIG. 7 is a graph illustrating a relationship between a edge ratio (x/t) and a minimum value Lx_min of a distance Lx which allows a characteristic change of CI value to be flat.

The inventors have found out the relationship illustrated in FIG. 7. FIG. 7 is a graph illustrating the minimum value Lx_min of the distance Lx which allows the characteristic change of the CI value to be flat when the change of the CI value is examined by changing the distance Lx for each edge ratio x/t. More specifically, the resonator element 10 was used in which the edge ratio x/t=15.88, 17.00, 18.00, and 20.00 is established. Table 1 represents a frequency F of each resonator element 10, the length x of the long side of the mesa substrate 12, the size M1 of the first stage mesa, the edge ratio x/t, and the minimum Lx_min.

TABLE 1

| F [MHz] | X [mm] | M1 [mm] | x/t | Lx_min [mm] |
|---|---|---|---|---|
| 26 | 1.4 | 0.9 | 17.00 | 0.12 |
| 27 | 1.4 | 0.86 | 18.00 | 0.1 |
| 24 | 1.4 | 0.86 | 20.00 | 0.04 |
| 24 | 1.4 | 0.73 | 20.00 | 0.11 |
| 24 | 1.05 | 0.63 | 15.88 | 0.1 |
| 24 | 1.05 | 0.63 | 15.88 | 0.16 |

It is thought that the relationship between the edge ratio x/t and the Lx_min is substantially in a proportional relationship as shown in FIG. 7. When in the equation, the Lx_min is represented as y, the minimum value y of the distance Lx which allows the characteristic change of the CI value to be flat can be represented by $y=-0.0136\times(x/t)+0.3471\pm0.0015\times(x/t)$ (1'). That is, by satisfying the equation (1'), the resonator element 10 is capable of decreasing the CI value while being miniaturized.

In the equation (1'), "$\pm0.0015\times(x/t)$" on the right side thereof represents an error. For example, as illustrated in FIG. 7, the resonator element 10 in which the edge ratio x/t is 15.88 has a case in which the Lx_min is 0.1 mm or 0.16 mm, and the difference between the two is set to be the error, and thus standardized value in the edge ratio x/t is "$\pm0.0015\times(x/t)$".

The equation (1') can be represented by $-0.0151\times(x/t)+0.3471 \leq y \leq -0.0121\times(x/t)+0.3471$ (1). That is, by satisfying the equation (1), the resonator element 10 is capable of decreasing the CI value while being miniaturized.

In addition, a straight line illustrated in FIG. 7 (a relational expression which does not express the error) can be represented by $y=-0.0136\times(x/t)+0.3471$ ... (5).

In addition, in the experimental example, the AT-cut quartz crystal substrate is used as the mesa substrate 12. However, the experimental example can be applied even when a piezoelectric substrate other than the AT-cut quartz crystal substrate is used. However, it is desirable that the quartz crystal substrate be used as the mesa substrate 12 in view of convenient substrate processing, that is, mesa processing.

In addition, in the experimental example, a silver paste is used as the bonding agent 30. However, the experimental example can be applied even when a conductive adhesive other than the silver paste is used.

In addition, in the experimental example, the resonator element 10 having a two-stage type mesa structure is used. However, the experimental example can be applied to a multi-stage type mesa structure having two stages or more.

Furthermore, in the experimental example, the resonator element 10 is used in which the excitation electrodes 20*a* and 20b are disposed on the inner side of the outer edge of the second portion 16a and the fourth portion 16b in plan view. However, the experimental example can be applied to a resonator element (see a vibration device 200 to be described later) on which the vibration section 12a is disposed within the outer edge of the excitation electrodes 20a and 20b.

In addition, in the experimental example, the end of the vibration section 12a in the Z' axial direction uses the resonator element 10 which does not have a stepped shape. However, the experimental example can be applied to a resonator element (see a resonator element 300 to be described later) in which the end in the Z' axial direction has a stepped shape.

3. Modification Example of Vibration Device

3-1. First Modification Example

Figure 8:
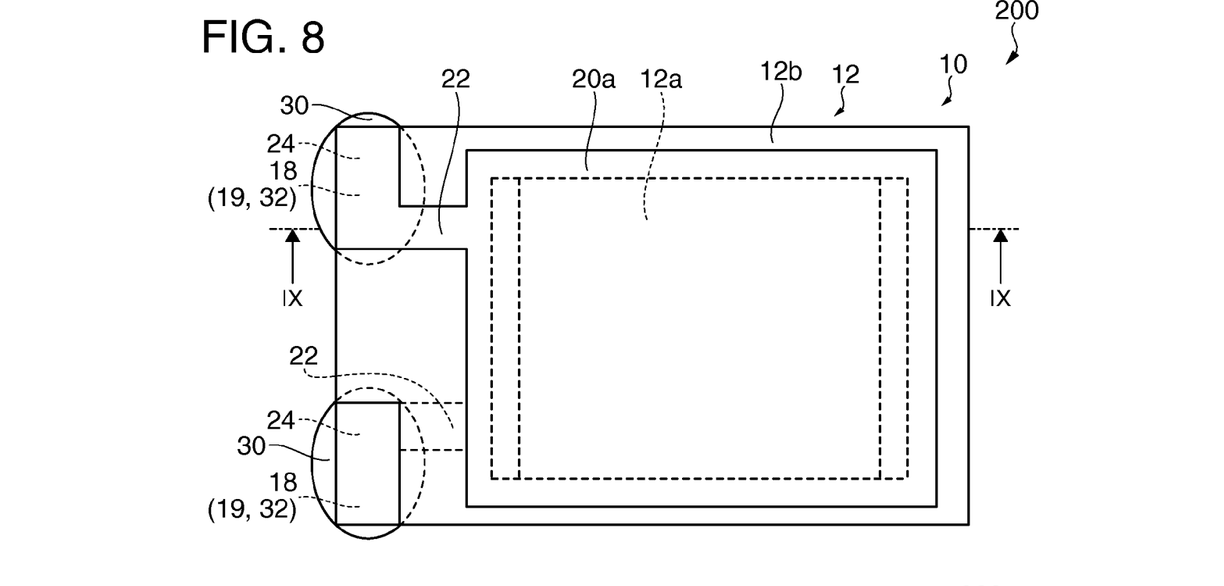
FIG. 8 is a plan view schematically illustrating a vibration device according to a first modification example of the embodiment.
Figure 9:
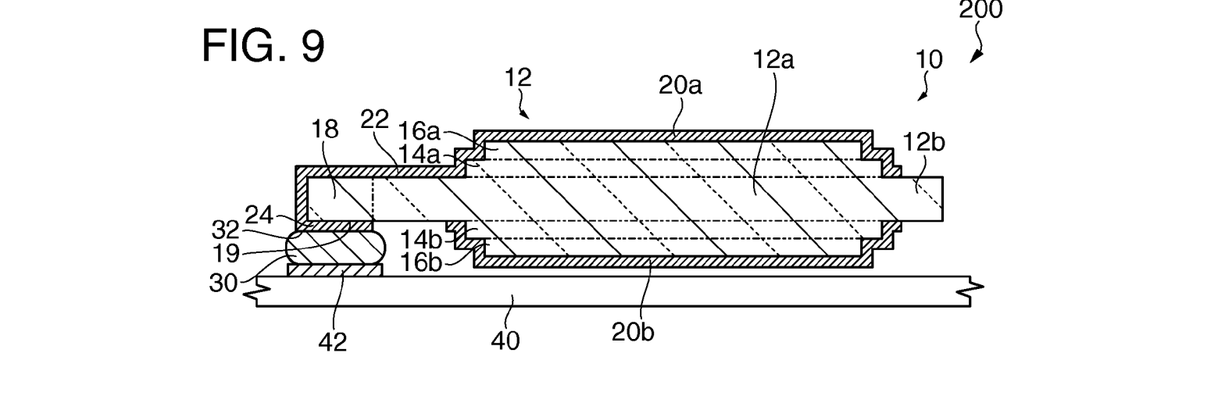
FIG. 9 is a cross-sectional view schematically illustrating a vibration device according to a first modification example of the embodiment.

A vibration device according to a first modification example of the embodiment will be described with reference to the drawings. FIG. 8 is a plan view schematically illustrating a vibration device 200 according to a first modification example of the embodiment. FIG. 9 is a cross-sectional view taken along a line IX-IX in FIG. 8, schematically illustrating the vibration device 200 according to the first modification example of the embodiment. In addition, in FIG. 8, for convenience, the mounting substrate 40 is not illustrated. Hereinbelow, in the vibration device 200, the same reference numerals are given with respect to members having the same function as the vibration device 100. Therefore, the detailed description thereof will be omitted.

In the vibration device 100, in plan view, as illustrated in FIG. 2, the first excitation electrode 20a is disposed within the outer edge of the second portion 16a, and the second excitation electrode 20b is disposed within the outer edge of the fourth portion 16a. On the other hand, in the vibration device 200, in plan view, as illustrated in FIG. 8, the first portion 14a and the second portion 16a are disposed within the outer edge of the first excitation electrode 20a, and the third portion 14b and the fourth portion 16b are disposed within the outer edge of the second excitation electrode 20b. That is, as illustrated in FIGS. 8 and 9, in the vibration device 200, the excitation electrodes 20a and 20b are disposed to completely cover the surface of the vibration section 12a.

According to the vibration device 200, by satisfying the equation (1), the resonator element 200 is capable of decreasing the CI value while being miniaturized, similarly to the vibration device 100. In addition, according to the vibration device 200, it is possible to increase a capacity ratio γ compared to the vibration device 100. Furthermore, the capacity ratio γ is obtained by dividing a capacity $C_0$ determined using a dimension (size) of the excitation electrodes 20a and 20b by a capacity $C_1$ determined using a substantial vibration region of the resonator element 10.

3.2. Second Modification Example

Figure 10:
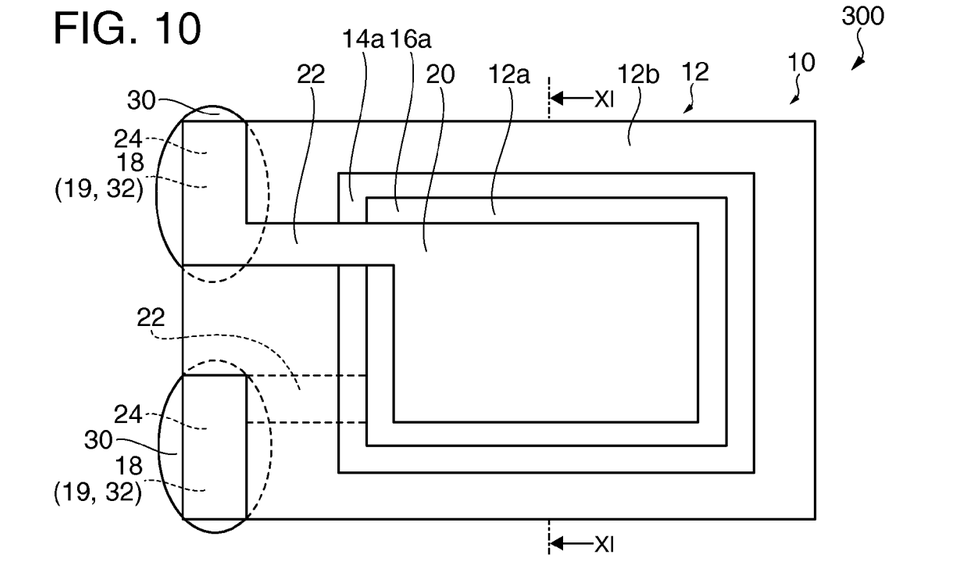
FIG. 10 is a plan view schematically illustrating a vibration device according to a second modification example of the embodiment.
Figure 11:
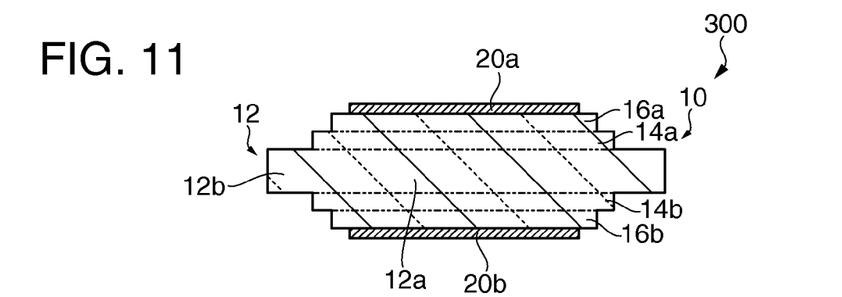
FIG. 11 is a cross-sectional view schematically illustrating a vibration device according to a second modification example of the embodiment.

A vibration device according to a second modification example of the embodiment will be described with reference to the drawings. FIG. 10 is a plan view schematically illustrating a vibration device 300 according to the second modification example of the embodiment. FIG. 11 is a cross-sectional view taken along a line XI-XI in FIG. 10, schematically illustrating a vibration device 300 according to the second modification example of the embodiment. In addition, in FIGS. 10 and 11, for convenience, the mounting substrate 40 is not illustrated. Hereinbelow, in the vibration device 300, the same reference numerals are given with respect to members having the same function as the vibration device 100. Therefore, the detailed description thereof will be omitted.

As illustrated in FIGS. 2 and 4, in the vibration device 100, a side surface (an end) of the vibration section 12a in the Z' axial direction does not have a stepped shape. That is, the end of the first portion 14a and the second portion 16a in the Z' axial direction is flush, and the end of the third portion 14b and the fourth portion 16b in the Z' axial direction is flush.

On the other hand, as illustrated in FIGS. 10 and 11, in the vibration device 300, the side surface (the end) of the vibration section 12a in the Z' axial direction has a stepped shape, and thus the step is formed. That is, the length of the first portion 14a in the Z' axial direction is longer than that of the second portion 16a in the Z' axial direction, and the length of the third portion 14b of the Z' axial direction is longer than that of the fourth portion 16b in Z' axial direction.

That is, by satisfying the equation (1), the resonator device 300 is capable of decreasing the CI value while being miniaturized, similarly to the vibration device 100.

4. Resonator

Figure 12:
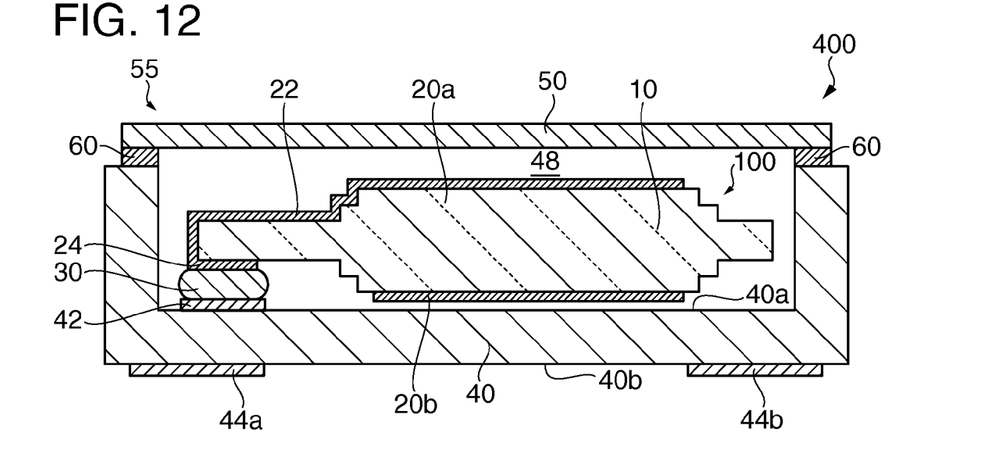
FIG. 12 is a cross-sectional view schematically illustrating a resonator according to the embodiment.

A resonator according to the embodiment will be described with reference to the drawings. FIG. 12 is a cross-sectional view schematically illustrating a resonator 400 according to the embodiment.

As illustrated in FIG. 12, the resonator 400 includes the resonator element according to the embodiment of the invention, and a package 55. More specifically, the resonator 400 includes the vibration device according to the embodiment of the invention. Hereinafter, as the vibration device according to the embodiment of the invention, an example will be described in which the vibration device 100 having the resonator element 10 is used.

The package 55 accommodates the vibration device 100. The package 55 includes a package base (a mounting substrate) 40, and a lid 50.

A concave portion 48 is formed within the package base 40 and the vibration device 100 is disposed within the concave portion 48. The planar shape of the package base 40 is not particularly limited thereto if the vibration device 100 can be disposed within the concave portion 48. The package base 40 uses a material such as aluminum oxide sintered body in which a molded ceramic green sheet is fired and stacked, crystal, glass, silicon and the like.

A first terminal 42 is disposed on a first surface (in the illustrated example, a bottom surface within the concave portion 48) 40a of the package base 40. The bonding agent 30 (a conductive adhesive) is disposed on the first terminal 42, and the first terminal 42 and a first excitation electrode 20a are electrically connected to each other.

The second terminals 44a and 44b used when being mounted on an external member such as an electronic apparatus are disposed on the second surface (the surface opposite to the first surface 40a) 40b of the package base 40. The second terminal 44a may be connected to the first terminal 42 via a contact portion (not illustrated) passing through the package base 40. In this manner, the second terminal 44a and the first excitation electrode 20a may be electrically connected to each other.

In addition, a terminal (not illustrated) is disposed on the first surface 40a, and the terminal and the second excitation electrode 20b may be electrically connected to each other. Then, the terminal and the second terminal 44b may be connected to each other via a contact portion (not illustrated) passing through the package base 40. Therefore, the second terminal 44b and the second excitation electrode 20b may be electrically connected to each other.

For example, the first terminal 42 and the second terminals 44a and 44b use a metal film in which a film such as nickel and gold is staked on a metallized layer such as tungsten using a method such as plating.

The lid 50 is provided to cover the concave portion 48 of the package base 40. In the illustrated example, the shape of the lid 50 is a plate shape. For example, lid 50 uses the same material as the package base 40, or metal such as Kovar, 42 alloy and stainless steel. For example, the lid 50 is bonded to the package base 40 via a bonding member 60 such as a seam ring, a low-melting glass and a bonding agent.

The inside of the hermetically sealed concave portion 48 of the package base 40 is in a decompressed vacuum state (a state with a high degree of vacuum), or in a state filled with an inert gas such as nitrogen, helium and argon.

The resonator 400 has a resonator element 10 capable of decreasing the CI value while being miniaturized.

5. Modification Example of Resonator

Figure 13:
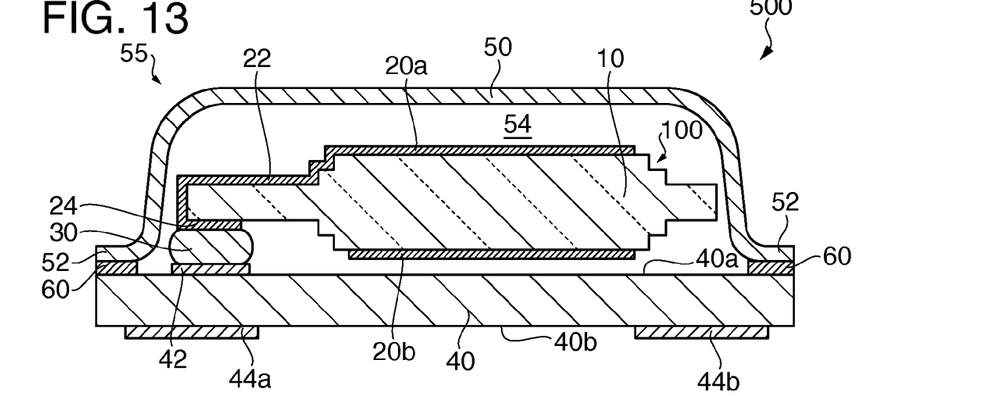
FIG. 13 is a cross-sectional view schematically illustrating a resonator according to a modification example of the embodiment.

A resonator according to the modification example of the embodiment will be described with reference to the drawings. FIG. 13 is a cross-sectional view schematically illustrating a resonator 500 according to a modification example of the embodiment. As described below, in the resonator 500, the same reference numerals are given with respect to members having the same function as the resonator 400. Therefore, the detailed description thereof will be omitted.

As illustrated in FIG. 12, in the resonator 400, the concave portion 48 is disposed within the package base 40. On the other hand, as illustrated in FIG. 13, in the resonator 500, the concave portion 48 is not disposed within the package base 40, and the package base 40 has a plate shape.

In the resonator 500, the lid 50 has a cap shape (a container shape) in which a flange section 52 is disposed on the entire periphery thereof and can accommodate the vibration device 100 inside space 54. The flange portion 52 is bonded to the package base 40 via a joining member 60. The lid 50 uses metal such as Kovar, 42 alloy and stainless steel.

According to the resonator 500, the package base 40 may not be provided with the concave portion 48 compared to the resonator 400, and thereby enabling easier manufacturing and a decreased manufacturing cost for the package base 40 that much.

6. Electronic Device

Figure 14:
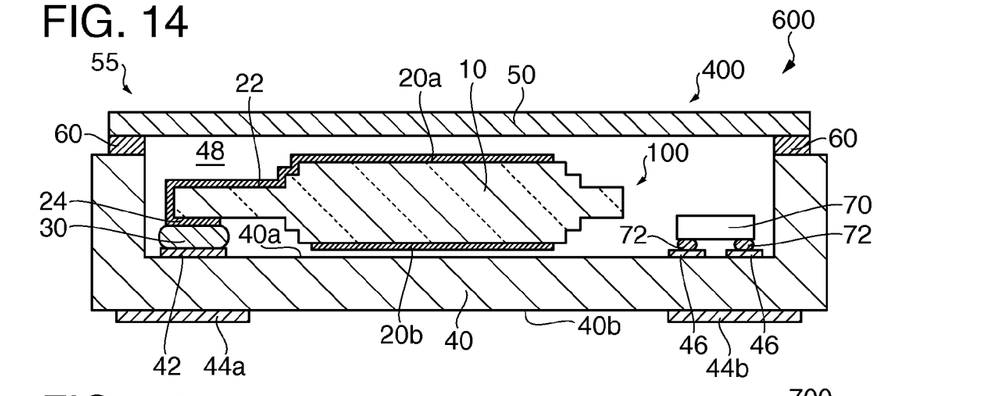
FIG. 14 is a cross-sectional view schematically illustrating an electronic device according to the embodiment.

An electronic device according to the embodiment will be described with reference to the drawings. FIG. 14 is a cross-sectional view schematically illustrating an electronic device 600 according to the embodiment.

As illustrated in FIG. 14, the electronic device 600 includes the resonator element according to the embodiment of the invention, and an electronic device 70. More specifically, the electronic device 600 includes the resonator according to the embodiment of the invention. Hereinafter, an example using the resonator 400 including the resonator element 10 will be described as the resonator according to the embodiment of the invention.

The electronic element 70 is accommodated in a package 55. More specifically, the electronic element 70 is disposed in the concave portion 48 disposed on the package base 40. For example, the electronic element 70 uses an IC chip provided with an oscillation circuit that drives the resonator element 10. Furthermore, the IC chip may be provided with a temperature compensation circuit that compensates for frequency variations due to a temperature change of the resonator element 10. When the IC chip including the oscillation circuit is used as the electronic element 70, the electronic device 600 can function as an oscillator. In addition, the electronic element 70 is not limited to the above-described IC chip, and for example, may be a thermistor, a capacitor and a reactance element.

The electronic element 70 is electrically connected to a third terminal 46 disposed on the first surface 40a of the package base 40 via a bump 72. For example, the third terminal 46 is electrically connected to the first terminal 42 by a wire (not illustrated). Therefore, the electronic element 70 and the first excitation electrode 20a are electrically connected to each other. In addition, the electronic element 70 is electrically connected to the second excitation electrode 20b by a wire (not illustrated).

For example, the bump 72 uses a metal bump such as gold and nickel. For example, the third terminal 46 uses a metal film in which a film such as nickel, gold and the like is stacked on a matrix layer such as tungsten using a method such as plating.

In addition, although not illustrated, the electronic element 70 may be electrically connected to the third terminal 46 by a wire in place of the bump 72.

The electronic device 600 can be provided with the resonator element 10 capable of decreasing the CI value while being miniaturized.

7. Modification Example of Electronic Device

Figure 15:
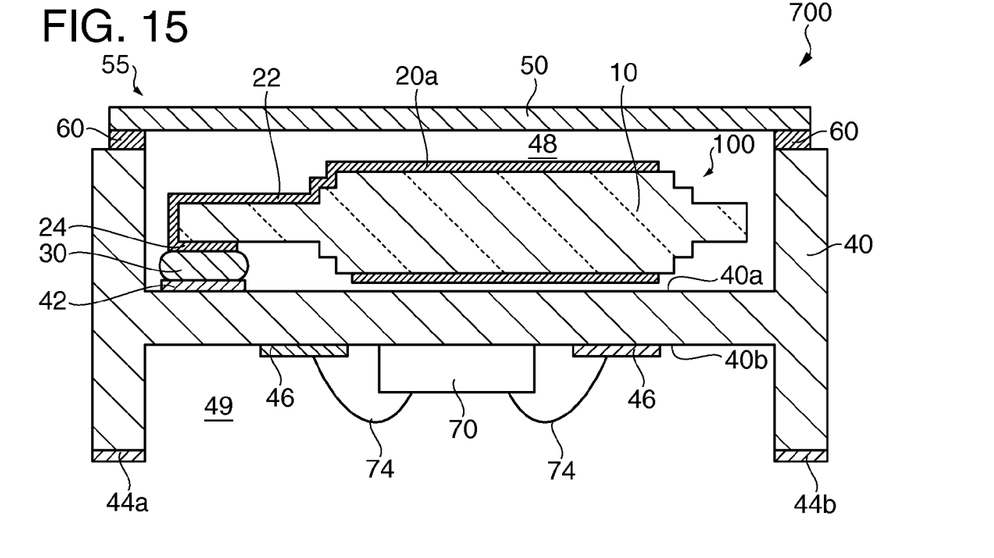
FIG. 15 is a cross-sectional view schematically illustrating an electronic device according to a modification example of the embodiment.

An electronic device according to a second modification example of the embodiment will be described with reference to the drawings. FIG. 15 is a cross-sectional view schematically illustrating an electronic device 700 according to a modification example of the embodiment. As described below, in the electronic device 700, the same reference numerals are given with respect to members having the same function as the electronic device 600. Therefore, the detailed description thereof will be omitted.

As illustrated in FIG. 14, in the electronic device 600, the electronic element 70 is disposed on the first surface 40a side of the package base 40, and is disposed within the concave portion 48 disposed in the package base 40. On the other hand, as illustrated in FIG. 15, in the electronic device 700, the electronic element 70 is disposed within a concave portion 49 in which the second surface 40b of the package base 40 forms the bottom surface. In the electronic device 700, the package base 40 may have substantially an H-shape.

The electronic element 70 may be bonded to the second surface 40b by a bonding agent (not illustrated). The electronic element 70 is electrically connected to the third terminal 46 disposed on the second surface 40b via a wire 74. For example, the material of the wire 74 is gold.

In addition, although not illustrated, the electronic element 70 may be electrically connected to the third terminal 46 by a bump in place of the wire 74.

According to the electronic device 700, the vibration device 100 and the electronic element 70 may be separated from each other. Accordingly, the vibration device 100 may be hermetically sealed individually, and thus the electronic device 700 has enhanced frequency aging characteristics.

8. Electronic Apparatus

Figure 16:
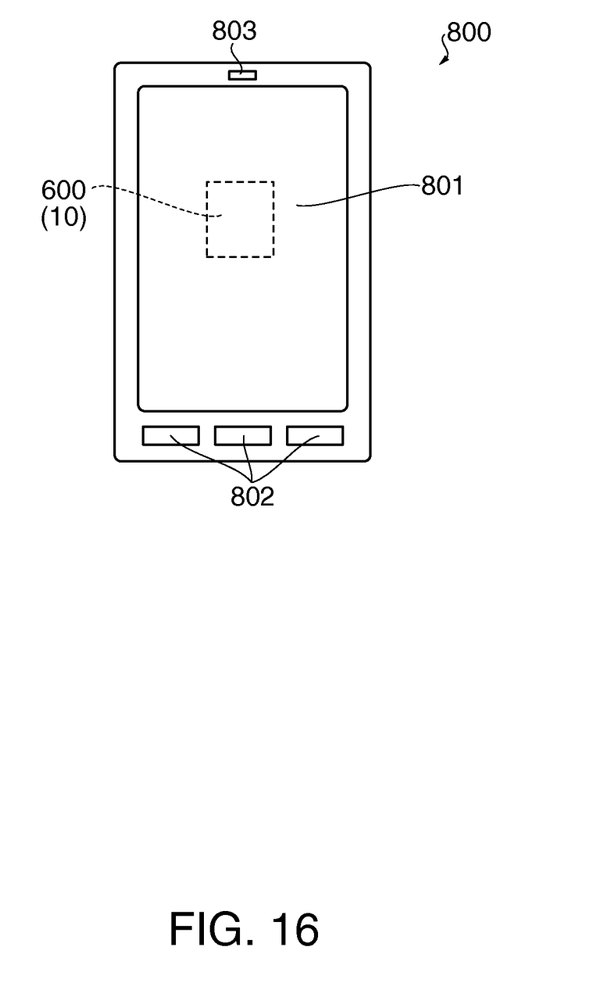
FIG. 16 is a plan view schematically illustrating an electronic apparatus according to the embodiment.

An electronic apparatus according to the embodiment will be described with reference to the drawings. FIG. 16 is a plan view schematically illustrating a mobile phone (a smart phone) as the electronic apparatus.

The smart phone 800 includes the resonator element according to the embodiment of the invention. More specifically, the smart phone 800 includes the electronic device according to the embodiment of the invention. Hereinafter, as illustrated in FIG. 16, as the electronic device according to the embodiment of the invention, an example using the electronic device 600 provided with the resonator element 10 will be described. In addition, in FIG. 16, for convenience, the electronic device 600 is simply illustrated.

The smart phone 800 uses the electronic device 600, for example, as a timing device such as a reference clock oscillation source. In addition, the smart phone 800 may include a display section 801 (such as a liquid crystal display and an organic EL display), an operation section 802, and a sound output section 803 (such as a microphone). The smart phone 800 may share the display section 801 as the operation section by providing a contact detection mechanism with respect to the display section 801.

The smart phone 800 may have the resonator element 10 capable of decreasing the CI value being miniaturized.

In addition, as described above, it is preferable that the electronic apparatus represented by the smart phone (the mobile phone) 800 includes an oscillation circuit that drives the resonator element 10, and a temperature compensation circuit that compensates for frequency variations due to a temperature change of the resonator element 10.

According to this configuration, the electronic apparatus represented by the smart phone 800 includes the temperature compensation circuit that compensates for the frequency variations due to the temperature change of the resonator element 10, together with the oscillation circuit that drives the resonator element 10. Therefore, a resonance frequency in which the oscillation circuit oscillates is temperature-compensated, and thus it is possible to provide the electronic apparatus having excellent temperature characteristics.

The electronic apparatus including the resonator element according to the embodiment of the invention is not limited to the smart phone, and may be preferably used as a timing device such as an electronic book, a personal computer, a television, a digital still camera, a video camera, a video recorder, a navigation device, a pager, an electronic organizer, a calculator, a word processor, a workstation, a videophone, a POS terminal and apparatus having a touch panel.

The above-described embodiments and modification examples are merely examples, and therefore, the invention is not limited thereto. For example, it is also possible to appropriately combine each of the embodiments and each of the modification examples.

The invention includes substantially the same configuration as the configuration described in the exemplary embodiment (for example, a configuration having the same function, method and result or a configuration having the same object and advantage). In addition, the invention includes a configuration obtained by replacing a non-essential part of the configuration described in the embodiment. Further, the invention includes a configuration which has the same effect as the configuration described in the embodiment, or a configuration capable of achieving the same object. Furthermore, the invention includes a configuration in which a known technology is added to the configurations described in the embodiments.

The entire disclosure of Japanese Patent Application No. 2012-062118, filed Mar. 19, 2012 is expressly incorporated by reference herein.

What is claimed is:

1. A resonator element comprising:
   a substrate including a vibration section that vibrates in a thickness shear vibration mode and has a step on a side surface, an outer edge that is disposed along an outer side of the vibration section and has a thickness thinner than that of the vibration section; and a bonding region that is provided on the outer edge and allows a bonding agent to be bonded for fixing to the mounting substrate;
   wherein when a length along a vibrating direction of the thickness shear vibration of the substrate is x, a thickness of the vibration section is t, and a distance between closest edges of the vibration section and the bonding region in a plan view is Lx, Lx is in a range of $-0.0151 \times (x/t)+0.3471 \leq Lx \leq -0.0121 \times (x/t)+0.3471$, and
   wherein when a difference between the thickness of the vibration section and the thickness of the outer edge is Md, and a percentage of a ratio of the Md to the t is z, a relationship of $-5 \leq z+1.32 \times (x/t)-42.87(\%)$ is satisfied.

2. The resonator element according to claim 1, wherein the relationship of $-5 \leq z+1.32 \times (x/t)-42.87 \leq 5(\%)$ is satisfied.

3. The resonator element according to claim 1, wherein an edge ratio (x/t) of the x to the t is 30 or less.

4. The resonator element according to claim 1, wherein the substrate is a Y-cut quartz crystal substrate that is cut out from a material along a plane on which an XZ lane is rotated around an X axis by an angle θ.

5. A resonator comprising:
   the resonator element according to claim 1; and
   a package that accommodates the resonator element.

6. A resonator comprising:
   the resonator element according to claim 2; and
   a package that accommodates the resonator element.

7. An electronic device comprising:
   the resonator element according to claim 1; and
   an electronic element.

8. An electronic device comprising:
   the resonator element according to claim 2; and
   an electronic element.

9. An electronic apparatus comprising the resonator element according to claim 1.

10. An electronic apparatus comprising the resonator element according to claim 2.

* * * * *